United States Patent
Xie et al.

(10) Patent No.: US 9,006,809 B2
(45) Date of Patent: Apr. 14, 2015

(54) MULTI-LANDING CONTACT ETCHING

(71) Applicant: Texas Instruments Incorporated, Dallas, TX (US)

(72) Inventors: Fei Xie, Sichuan (CN); Wen Cheng Tien, Sichuan (CN); Ya Ping Chen, Sichuan (CN); Li Bin Man, Sichuan (CN); Kuo Jung Chen, Sichuan (CN); Yu Liu, Sichuan (CN); Tian Yi Zhang, Sichuan (CN); Sisi Xie, Sichuan (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/280,911

(22) Filed: May 19, 2014

(65) Prior Publication Data

US 2014/0252457 A1    Sep. 11, 2014

Related U.S. Application Data

(62) Division of application No. 13/433,665, filed on Mar. 29, 2012, now Pat. No. 8,765,592.

(51) Int. Cl.

| H01L 27/108 | (2006.01) |
|---|---|
| H01L 29/94 | (2006.01) |
| H01L 29/78 | (2006.01) |
| H01L 21/8234 | (2006.01) |
| H01L 21/768 | (2006.01) |
| H01L 29/417 | (2006.01) |
| H01L 29/423 | (2006.01) |
| H01L 29/66 | (2006.01) |
| H01L 29/45 | (2006.01) |
| H01L 29/49 | (2006.01) |

(52) U.S. Cl.
CPC .... *H01L 29/7827* (2013.01); *H01L 21/823425* (2013.01); *H01L 21/823443* (2013.01); *H01L 21/823456* (2013.01); *H01L 21/76897* (2013.01); *H01L 21/823475* (2013.01); *H01L 21/76816* (2013.01); *H01L 29/41766* (2013.01); *H01L 29/42372* (2013.01); *H01L 29/4238* (2013.01); *H01L 29/456* (2013.01); *H01L 29/4933* (2013.01); *H01L 29/66719* (2013.01); *H01L 29/66727* (2013.01); *H01L 29/7811* (2013.01)

(58) Field of Classification Search
USPC ........... 257/E27.096, E29.182, E29.262, 302, 257/341, 382, 502
See application file for complete search history.

(56) References Cited

U.S. PATENT DOCUMENTS

| 6,451,708 | B1 | 9/2002 | Ha |
| 7,105,453 | B2 | 9/2006 | Chen et al. |
| 7,709,369 | B2 | 5/2010 | Lee et al. |
| 2012/0061754 | A1 | 3/2012 | Hsieh |

*Primary Examiner* — Asok K Sarkar
(74) *Attorney, Agent, or Firm* — Jacqueline J. Garner; Frank Cimino

(57) ABSTRACT

A method for contacting MOS devices. First openings in a photosensitive material are formed over a substrate having a top dielectric in a first die area and a second opening over a gate stack in a second die area having the top dielectric, a hard mask, and a gate electrode. The top dielectric layer is etched to form a semiconductor contact while etching at least a portion the hard mask layer thickness over a gate contact area exposed by the second opening. An inter-layer dielectric (ILD) is deposited. A photosensitive material is patterned to generate a third opening in the photosensitive material over the semiconductor contact and a fourth opening inside the gate contact area. The ILD is etched through to reopen the semiconductor contact while etching through the ILD and residual hard mask if present to provide a gate contact to the gate electrode.

4 Claims, 6 Drawing Sheets

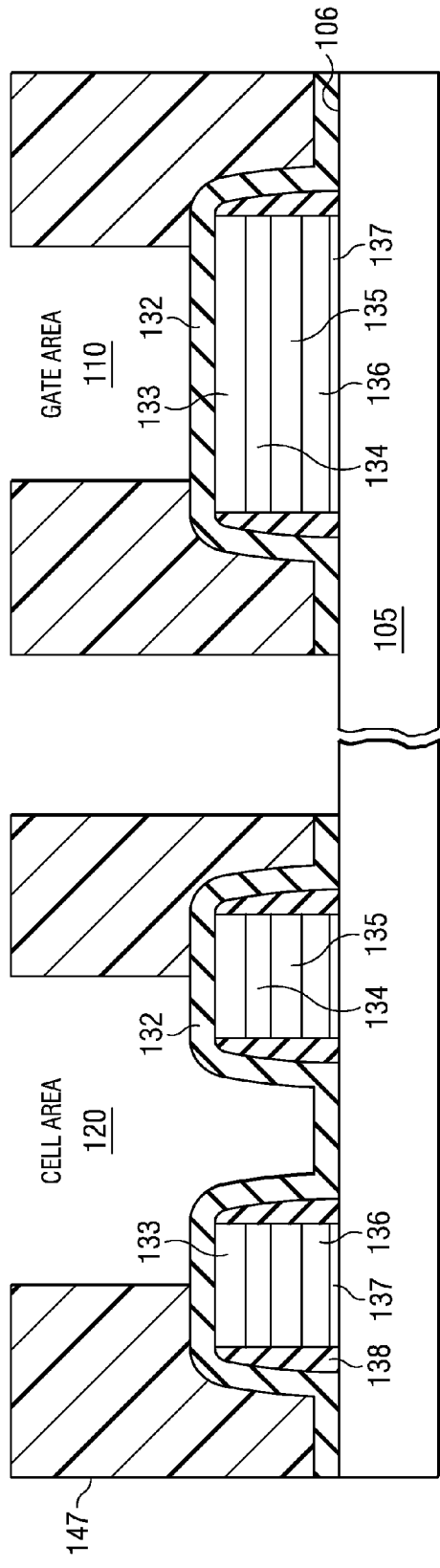
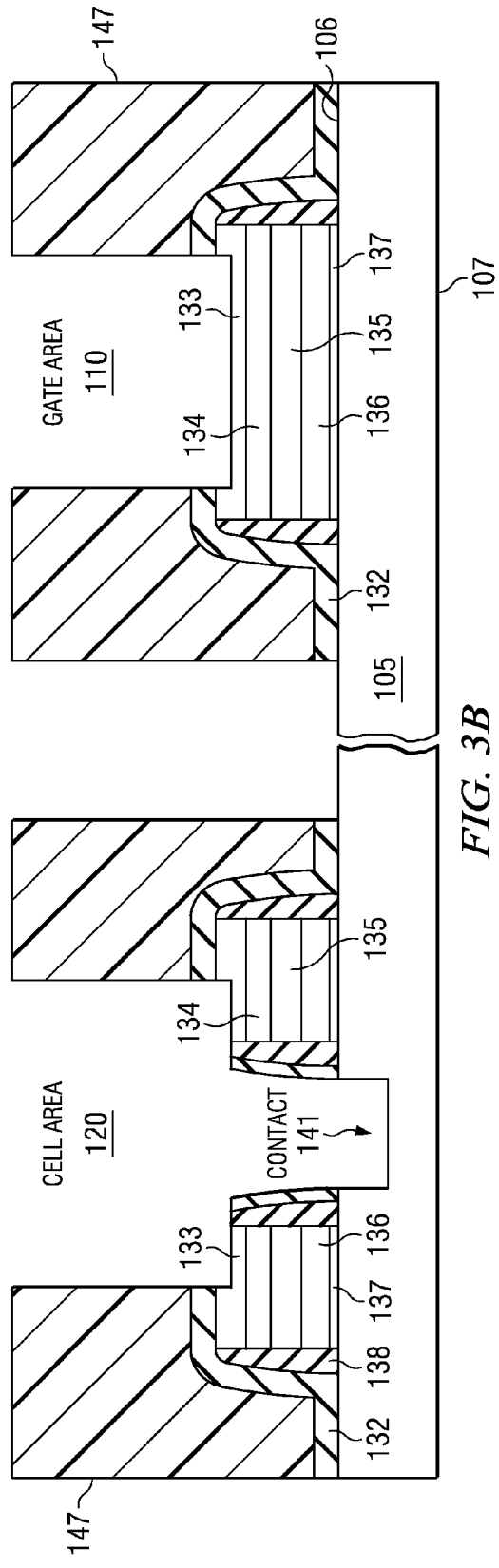
FIG. 3A
FIG. 3B

MULTI-LANDING CONTACT ETCHING

CROSS REFERENCE TO RELATED APPLICATIONS

This application is a divisional of U.S. Nonprovisional patent application Ser. No. 13/433,665, filed Mar. 29, 2012, the contents of which are herein incorporated by reference in its entirety.

FIELD

Disclosed embodiments relate to multi-landing contact etch processing and semiconductor devices therefrom.

BACKGROUND

In some process flows for semiconductor devices having metal-oxide-semiconductor (MOS) transistors at the contact level there is a need for two or more contact masking levels due to pattern density and/or stop layers differences between different regions of the die, such as in higher pattern density "cell areas" and lower density "gate areas". FIG. 1 is a simplified top view depiction of a portion of a semiconductor power device 100 formed using a known method for contact etching comprising a substrate 105 having a topside semiconductor surface (e.g., silicon surface) 106 having a plurality of vertical power MOS transistors. Inter-layer dielectric (ILD) and metal is omitted in FIG. 1 to show the hard mask layer 133 on the gate stacks and the various MOS transistor contacts.

The vertical power MOS transistors each have a gate contact 111 shown in the gate area 110 to gate lines 115, which are polysilicon gate contacts in the case of polysilicon gates, as well as a semiconductor contact 121 in the cell area 120 between adjacent gate lines 115. Although the gate lines 115 are shown as being linear throughout, in a practical power device the gate lines are not linear throughout. The gate lines 115 are each gate stacks including the hard mask layer 133 shown on a gate electrode on a gate dielectric (both gate electrode and gate dielectric not shown). The hard mask layer 133 on each gate line 115 has a substantially constant thickness (typically a range of <1%), set by the local uniformity provided by the hard mask layer deposition tool. The semiconductor contact 121 provides either a source or a drain for the vertical power MOS transistors, with the other of the source and the drain provided by a bottomside contact 107 to the substrate 105. In a practical power device, there are a very large number of power MOS devices in parallel so that there are a large number of semiconductor contacts 121 in the cell area 120 and a large number of gate contacts 111 in the gate area 110.

At what may be referred to as the "source" contact mask level, the gate area 110 is fully masked (i.e. covered, such as by a photoresist), and the source contact etch reaches the semiconductor surface 106 in the cell area 120. A Ti/TiN or other suitable diffusion barrier layer comprising a refractory metal is then typically added to the exposed semiconductor surface, followed by a layer of inter-layer dielectric (ILD) over the respective semiconductor die on the wafer.

A second contact level that may be referred to as the "drain" contact mask level then follows. At this level, openings in both the gate area 110 and in the cell area 120 are formed in photoresist. This etch is required to etch through ILD and the hard mask (typically $Si_3N_4$; silicon nitride) over the gate area 110 to reach a metal silicide (e.g., $WSi_2$) on the gate contacts 111 in the gate area 110, while stopping on the TiN barrier over the semiconductor contacts 121 in the cell area 120.

It is a challenge to provide an etch process consistently able to etch through the gate area hard mask layer (e.g., $Si_3N_4$) to reach the metal silicide (e.g., $WSi_2$) on the gate contacts 111 in the gate area 110 to allow contact thereto, while stopping on the TiN or other barrier layer on the semiconductor contacts 121 in the cell area 120 without substantial barrier layer thinning during the same etch process. This challenge arises because this etch process needs a high silicon nitride/oxide etch selectivity to etch through the silicon nitride hard mask. Meanwhile, the same etch process needs a low silicon nitride/oxide etch selectivity to land (stop) on the barrier layer (e.g., TiN on Ti) on the semiconductor contacts 121 in the cell area 120. This challenge can result in leaving residual silicon nitride hard mask on the gate contacts 111 in the gate area 110 which causes electrical opens or high resistance contacts, known to result in yield loss.

SUMMARY

Disclosed embodiments included contact etching a semiconductor device having a plurality of metal-oxide-semiconductor (MOS) devices having first areas also referred to herein as "cell areas" including semiconductor contacts and second areas also referred to herein as "gate areas" that include gate contacts, using two contact masking levels. The first areas/cell areas and the second areas/gate areas are positioned laterally to one another have different patterned densities, with the first areas/cell areas having a higher pattern density as compared to the second areas/gate areas.

In a first contact masking level, semiconductor contacts in the cell area are provided and at least a portion of the hard mask layer over the gate contact in the gate area is etched. Following an ILD deposition, in a second contact masking level semiconductor contacts to the semiconductor in the cell area are reopened, and the gate contacts to the gate electrode in the gate area are provided. The gate contacts in the gate area are thus patterned and the hard mask layer etched in each of the two contact masking levels, so that the hard mask thickness is reduced (or is zero in one embodiment) for the second contact masking level. By changing a single contact mask so that the gate contacts in the gate area are patterned and etched in each of the two contact masking levels, disclosed embodiments have been found to overcome the yield problem described in the background above where there can be residual hard mask material on the gate contacts in the gate area after the contact process that can cause electrically open (or high resistance) gate contacts.

BRIEF DESCRIPTION OF THE DRAWINGS

Figure 1:
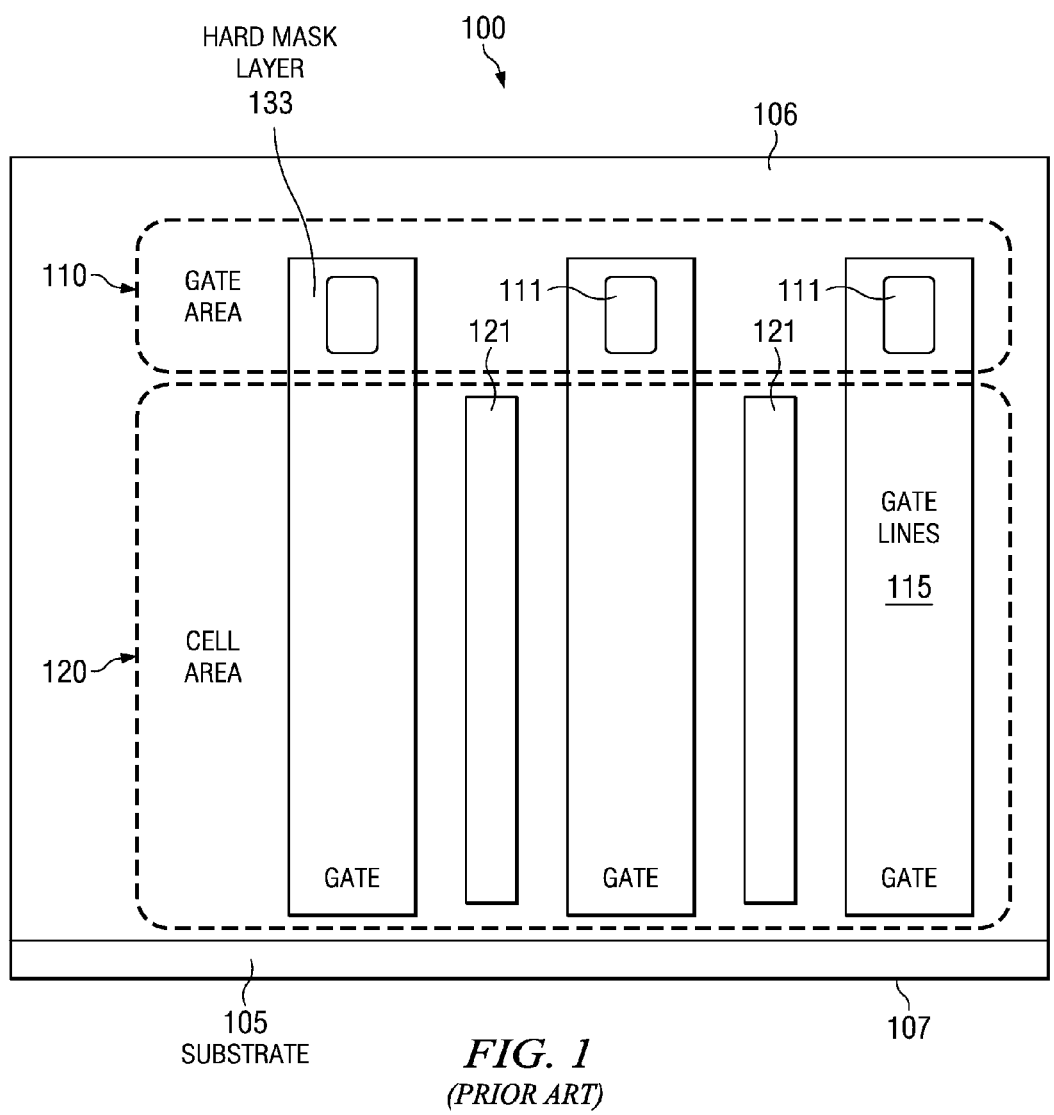

Having thus described the invention in general terms, reference will now be made to the accompanying drawings, which are not necessarily drawn to scale, and wherein:

FIG. 1 is a simplified top view depiction of a portion of a power semiconductor device formed using a known method for contact etching having vertical power MOS devices having gate contacts in the gate area to gate lines, as well as semiconductor contacts in the cell area between adjacent gate lines.

Figure 2:
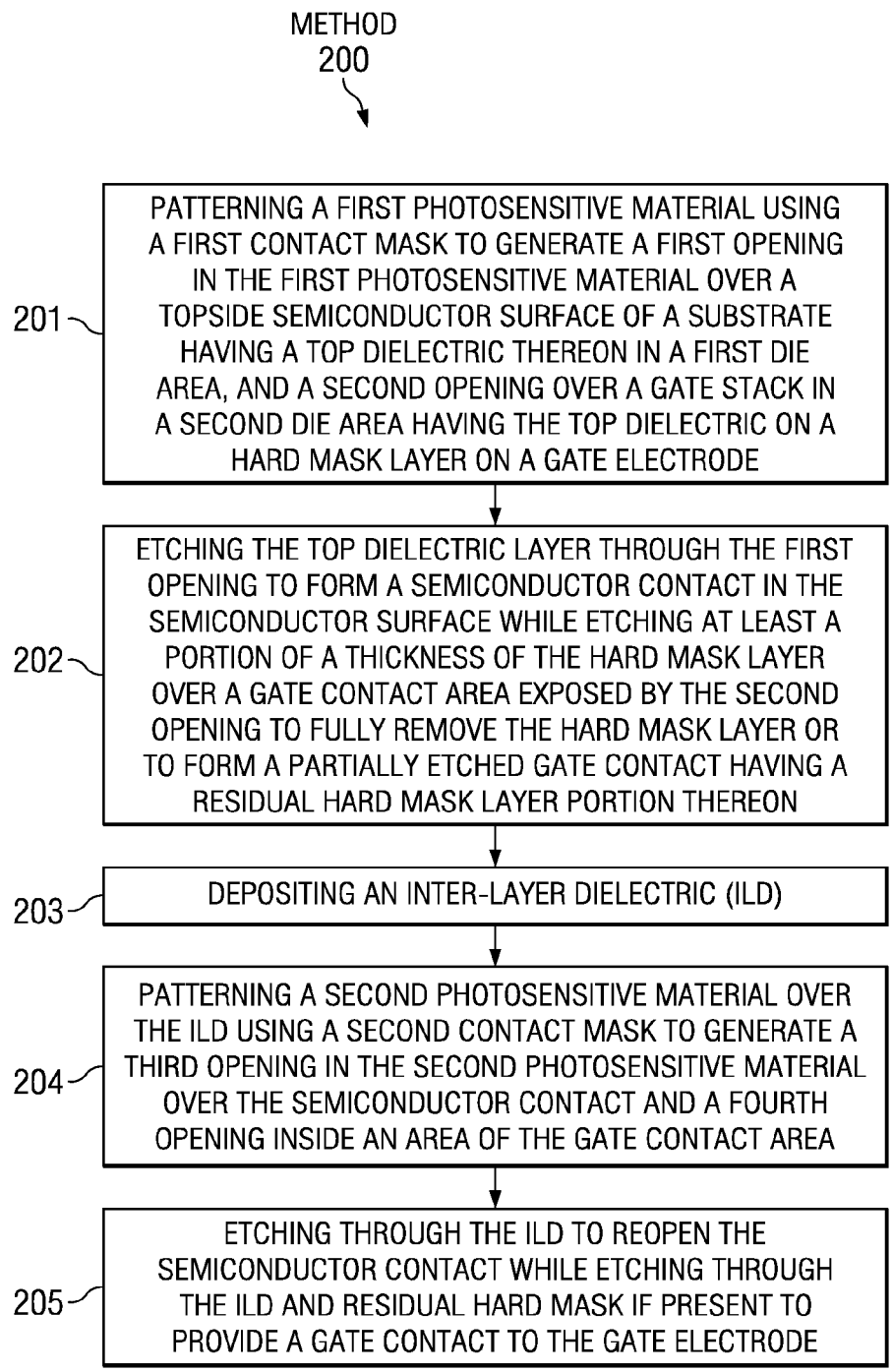

FIG. 2 is a flow chart that shows steps in an example method for contact etching a power semiconductor device, according to an example embodiment.

FIGS. 3A-3D are cross-sectional diagrams showing processing progression for the example method described relative to FIG. 2, according to an example embodiment.

Figure 4:
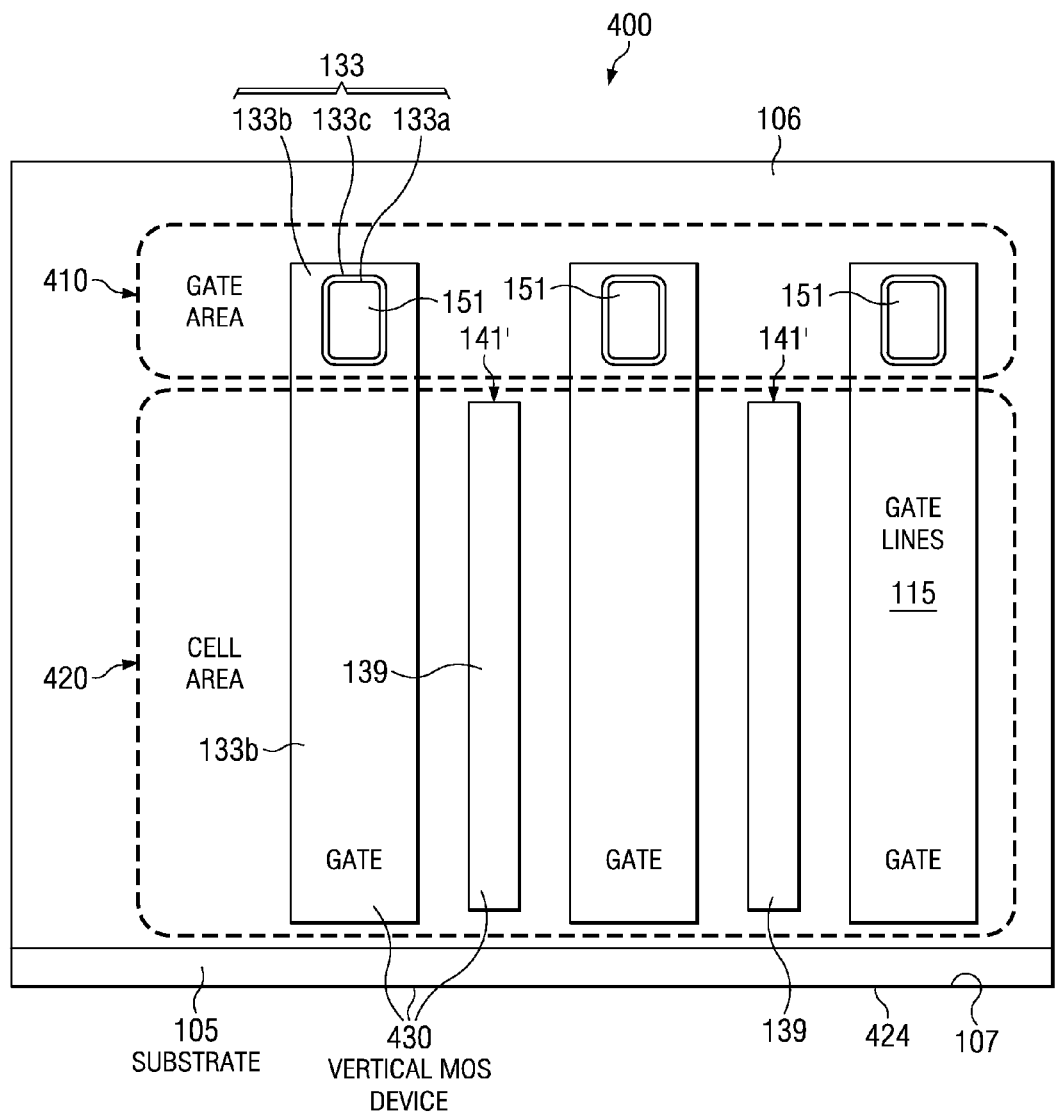

FIG. 4 is a simplified top view depiction of a portion of an example power semiconductor device formed using a disclosed method for contact etching having vertical power MOS devices having gate contacts in the gate area to gate lines as well as semiconductor contacts in the cell area between adjacent gate lines, according to an example embodiment.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 2 is a flow chart that shows steps in an example method 200 for contact etching a power semiconductor device, according to an example embodiment. Step 201 comprises patterning a first photosensitive material (e.g., photoresist) using a first contact mask to generate a first opening in the first photosensitive material over a topside semiconductor surface 106 of a substrate 105 having a top dielectric thereon in a first die area shown as cell area 120, and a second opening over a gate stack in a second die area shown as gate area 110 having the top dielectric on a hard mask layer on a gate electrode. FIG. 3A is a cross sectional depiction of the partially fabricated die after step 201. As well known in semiconductor processing, a plurality of such die are generally processed together on a wafer during practice of method 200.

The photosensitive material, such as a photoresist, is shown as 147. The gate stacks shown comprise a top dielectric layer 132 (e.g., a TEOS derived silicon oxide), on a hard mask layer 133 (e.g. silicon nitride), on another dielectric layer 134 (e.g., a TEOS silicon oxide), on a gate electrode comprising a silicide layer 135 (e.g. tungsten silicide), on a polysilicon layer 136, on a gate dielectric layer 137. A spacer layer 138 is also shown on the sidewalls of the respective gate stacks. The respective layers 132-136 are each generally 100 to 200 nm thick, and the photosensitive material 147 is generally 1,000 to 2,000 nm thick.

The top dielectric layer 132 can comprise a silicon oxide, such as deposited using a TEOS precursor. The hard mask layer 133 can comprise silicon nitride or silicon oxynitride. The cell area 120 generally has a higher pattern density as compared to the gate area 110. Although not shown, there are a large number of gate stacks in both the cell area 120 and the gate area 110. Moreover, although the shape of disclosed contacts is shown below as being rectangular, disclosed contacts may be various shapes including round, square, octagon, or irregular.

Step 202 comprises etching the top dielectric layer 132 through the first opening to form a semiconductor contact 141 in the semiconductor surface 106 in the cell area 120 while etching only at least a portion of a thickness of the hard mask layer 133 exposed by the second opening to form an etched gate contact having a no residual hard mask layer or a thinned residual hard mask layer portion thereon in the gate area 110. The residual hard mask layer portion is between 0 (complete removal) and 80% of the thickness of the hard mask layer 133, and is typically ≥10% to 80% of the thickness of the hard mask layer. A typical etch recipe will include several percent (usually more than 30%) over etch time in total etching time (total etching time=main etching time+over etching time). The depth into the semiconductor of the semiconductor contact 141 is generally between about 30 nm to 200 nm.

FIG. 3B is a cross sectional depiction of the partially fabricated device after step 202. Part of hard mask layer 133 of the gate stacks in the cell area 120 are shown partially etched, while the semiconductor contact 141 can be seen to optionally be a self-align semiconductor contact process, that utilizes adjacent gate stacks in cell area for defining the area of the semiconductor contact 141.

In some embodiments, a barrier metal process comprising barrier metal deposition (e.g., sputter), followed by barrier metal lithography and etching is included between step 202 and step 203 described below to form a patterned barrier layer comprising a refractory metal. The barrier layer can comprise TiN, Ti, W, or alloys or combinations thereof, including some non-refractory metal layers such as Al on refractory metal layer(s). For example, in one embodiment the barrier layer comprises Al or W on Ti/TiN. A barrier metal (e.g., titanium followed by titanium nitride) is first deposited. A photoresist is then coated. The cell area is protected with photoresist and all the gate area's photoresist is exposed and removed. A barrier metal etching process removes the barrier metal which covers the gate area. The barrier layer is patterned and remains on the cell area contacts.

Figure 3C:
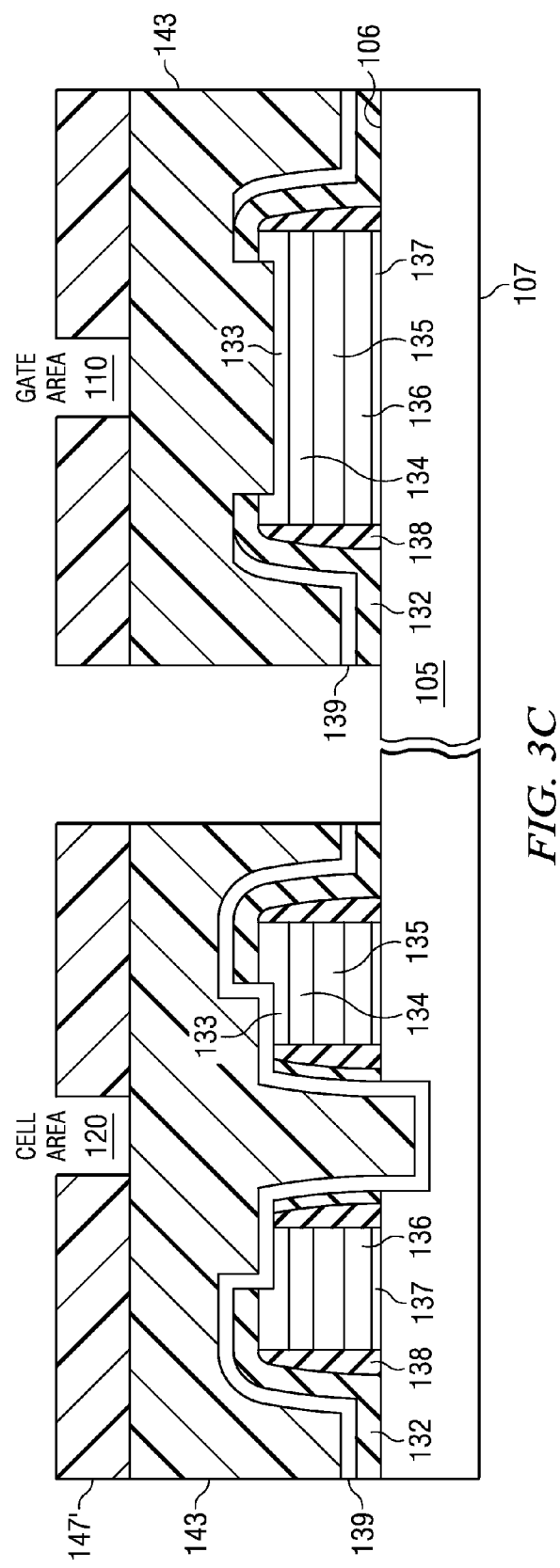

Step 203 comprises depositing an inter-layer dielectric (ILD). In some embodiments a chemical mechanical polish (CMP) process follows step 203 and is before step 204 described below. In step 204 the second photosensitive material 147' is patterned over the ILD using a second contact mask to generate a third opening in the second photosensitive material over the semiconductor contact and a fourth opening inside an area of the partially etched gate contact. FIG. 3C is a cross sectional depiction of the partially fabricated die after step 204 showing ILD 143, in a process that includes forming a patterned barrier layer 139 comprising a refractory metal between step 202 and step 203 as described above. Step 205 comprises etching the ILD 143 through to reopen the semiconductor contact shown as 141' due to the presence of barrier layer 139 while etching through the ILD 143 and residual hard mask 133 to provide a gate contact 151 to the gate electrode 135/136.

Figure 3D:
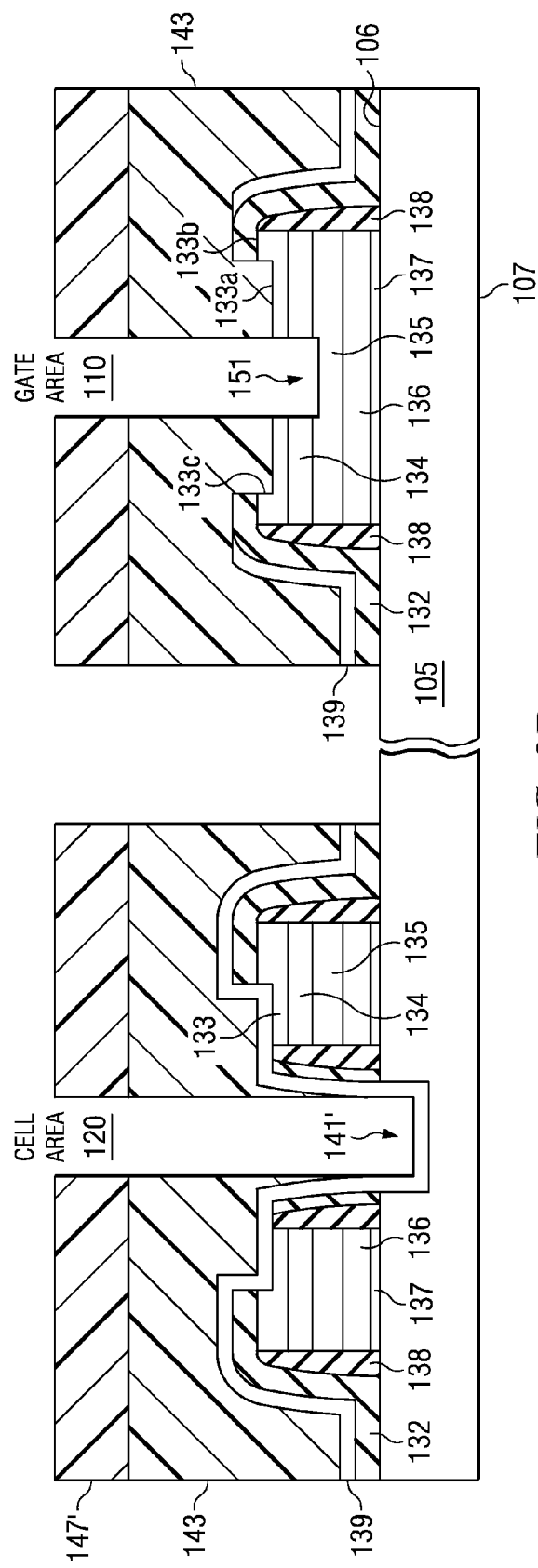

FIG. 3D is a cross sectional depiction of the partially fabricated die after step 205. The gate contact 151 is shown framed by the hard mask layer 133 having a first thickness in an inner region 133a and a second thickness in an outer region 133b surrounding the inner region 133a and along the length of the gate lines away from gate contact 151, with a sidewall region 133c having a vertical component between the inner region 133a and outer region 133b. The hard mask layer thickness in the inner region 133a is typically ≥10% of the hard mask layer thickness in the outer region 133b, and is generally between 20% and 80% of the hard mask layer thickness in the outer region 133b. Subsequent processing generally includes contacting the bottomside of the substrate which will provide a common source or drain for the MOS transistors on the device, followed by metallization and passivation. In one power transistor flow, the only contacts to the gate area 110 are to gate contacts, the only contacts to the cell area 120 are to semiconductor contacts 141', and the bottomside substrate contact provides a common third device contract (source or drain) for the respective MOS transistors.

FIG. 4 is a simplified top view of a power semiconductor device 400 comprising a plurality of vertical MOS devices 430 fabricated using a disclosed method for contact etching, such as method 200 described above. The simplified top view shows the various layers of the gate stacks associated with vertical MOS devices 430 provided in FIG. 3D also described above. Inter-layer dielectric (ILD) and metal is omitted from FIG. 4 to show the hard mask layer 133 on the gate stacks and the various MOS transistor contacts.

One unique feature resulting from practice of method 200 reflected in completed disclosed devices is the hard mask layer 133 outside the gate contact 151 over the gate electrodes 135/136 in the gate area has a first thickness in an inner region 133a bordering the gate contact 151 and has a second thickness that is at least twenty (20) percent thicker than the first thickness in an outer region 133b surrounding the inner region 133a. A barrier layer 139 comprising a refractory metal is shown lining the semiconductor contact 141'. As noted above, although the gate lines 115 are shown as being linear throughout, in a practical power device the gate lines are not linear throughout.

Power semiconductor device 400 includes a substrate 105 having a topside semiconductor surface 106 and a bottomside surface 107. A metal layer 424 is on the bottomside surface 107 which provides a common source or drain for the vertical MOS devices 430 on power semiconductor device 400. As shown in FIG. 3D, MOS devices 430 include a gate stack that includes a hard mask layer 133 on a gate electrode 135/136 such as a silicide on polysilicon on a gate dielectric 137. Power semiconductor device 400 includes a second die area 410 shown as "gate area" having gate contacts 151, and first semiconductor contacts 141' in a first die area 420. As noted above, the hard mask layer 133 can comprise silicon nitride or silicon oxynitride. In one embodiment the substrate 105 can comprise silicon, and the gate stack can comprise a polysilicon gate having a silicide thereon.

Disclosed embodiments can be used to form a variety of different semiconductor devices including power devices, integrated circuit (IC) devices, and related products. The semiconductor devices may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A semiconductor device, comprising:
a substrate having a topside semiconductor surface and a bottomside surface;
a plurality of vertical metal-oxide-semiconductor (MOS) devices on said substrate including at least one gate stack including a hard mask layer on a gate electrode on a gate dielectric on said topside semiconductor surface including a gate contact through said hard mask layer in a second die area, and a first semiconductor contact in a first die area;
a second semiconductor contact on said bottomside surface of said substrate;
wherein said gate contact is framed by said hard mask layer having a first thickness in an inner region framing said gate contact and a second thickness in an outer region surrounding said inner region, wherein a sidewall region having a vertical component is between said inner region and said outer region,
wherein said first thickness is ≥ten percent of said second thickness.

2. The semiconductor device of claim 1, wherein said hard mask layer comprises silicon nitride or silicon oxynitride.

3. The semiconductor device of claim 1, wherein said substrate comprises silicon, and said gate stack comprises a polysilicon gate having a silicide thereon.

4. The semiconductor device of claim 1, further comprising a barrier layer comprising a refractory metal lining said semiconductor contact.

* * * * *